(12) United States Patent
Uchida et al.

(10) Patent No.: US 8,270,177 B2
(45) Date of Patent: Sep. 18, 2012

(54) ELECTRONIC DEVICE AND METHOD FOR MANUFACTURING ELECTRONIC DEVICE

(75) Inventors: Kenji Uchida, Kanagawa (JP); Koki Hirasawa, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 362 days.

(21) Appl. No.: 12/213,967

(22) Filed: Jun. 26, 2008

(65) Prior Publication Data

US 2009/0027869 A1 Jan. 29, 2009

(30) Foreign Application Priority Data

Jul. 27, 2007 (JP) ................................ 2007-195683
Dec. 13, 2007 (JP) ................................ 2007-321587

(51) Int. Cl.
*H05K 1/18* (2006.01)
(52) U.S. Cl. ........................................ 361/761; 174/250
(58) Field of Classification Search .................. 361/761, 361/760, 829; 257/666, 680, 704; 174/250
See application file for complete search history.

(56) References Cited

U.S. PATENT DOCUMENTS

| | | | | |
|---|---|---|---|---|
| 5,183,972 | A * | 2/1993 | Duane et al. .................. | 174/251 |
| 5,792,520 | A * | 8/1998 | Yamashita et al. ............. | 427/555 |
| 7,276,393 | B2 * | 10/2007 | Derderian et al. .............. | 438/51 |
| 7,813,043 | B2 * | 10/2010 | Lusinchi et al. ............... | 359/619 |
| 2004/0094825 | A1 * | 5/2004 | Onishi et al. .................. | 257/666 |
| 2009/0027869 | A1 | 1/2009 | Uchida et al. | |
| 2009/0147115 | A1 * | 6/2009 | Tanida et al. .................. | 348/294 |
| 2010/0142169 | A1 | 6/2010 | Uchida et al. | |

FOREIGN PATENT DOCUMENTS

| | | |
|---|---|---|
| JP | 4-69958 | 3/1992 |
| JP | 04-069958 | 3/1992 |
| JP | 7-202152 | 8/1995 |
| JP | 9-232366 A | 9/1997 |
| JP | 2001-257334 | 9/2001 |
| JP | 2002-231919 A | 8/2002 |
| JP | 2005-323186 A | 11/2005 |
| KR | 20060104949(A) | 10/2006 |

OTHER PUBLICATIONS

Korean Office Action dated Nov. 30, 2010 (with English translation).
Office Action dated Dec. 22, 2010 for U.S. Appl. No. 12/630,466.
Japanese Office Action dated May 22, 2012 with a partial English translation thereof.

* cited by examiner

*Primary Examiner* — Yuriy Semenenko
(74) *Attorney, Agent, or Firm* — McGinn IP Law Group, PLLC

(57) ABSTRACT

An electronic device is provided with an improved reliability and a reduced contamination in a functional unit of an exposed element, and a method for manufacturing thereof is also provided. An electronic device includes a light receiving element, a frame member composed of a first resin provided so as to surround a photo acceptor unit of the light receiving element, and an encapsulating resin layer composed of a second resin and filling a periphery of the frame member. The photo acceptor unit of the light receiving element is exposed in a space surrounded by the frame member. The upper surface of the frame member and the upper surface of the encapsulating resin layer form a common plane, or the upper surface of the frame member is higher than the upper surface of the encapsulating resin layer.

20 Claims, 14 Drawing Sheets

RELATED ART

RELATED ART

RELATED ART

ELECTRONIC DEVICE AND METHOD FOR MANUFACTURING ELECTRONIC DEVICE

The present application is based on Japanese patent applications No. 2007-195683 and No. 2007-321587, the contents of which are incorporated hereinto by reference.

BACKGROUND

1. Technical Field

The present invention relates to an electronic device and a method for manufacturing an electronic device.

2. Related Art

Electronic devices having exposed portions in functional elements are being developed for practical uses to meet the needs in recent technological advances. The developments of such type of devices are based on requirements for reducing an attenuation of an optical signal and an improved moisture resistance of electronic devices for meeting with a reflow condition in mounting a lead free by employing a black resin in an electronic device that converts an optical signal into an electrical signal and directly introduces an optical signal entered from an outside of the electronic device into a photo acceptance of the optical device. In particular, in optical recording technologies utilizing blue light as an optical signal, epoxy resins employed in light-receiving devices for transforming the optical signals into electrical signals are deteriorated by the blue light to be in failure condition, and therefore, the above-mentioned electronic devices having exposed portions in functional elements, in which epoxy resin is eliminated from the optical path, are required. In addition, the electronic devices having such structure include movable elements in functional elements such as micro electro-mechanical systems (MEMS), electric acoustic filters and the like, and the above-described types of electronic devices are expected to be adopted for devices having movable elements that cannot be encapsulated with a resin or for solid-state image sensing elements for cameras.

FIG. 12 is a cross-sectional view, illustrating a solid-state imaging device described in Japanese Patent Laid-Open No. 2001-257,334. As shown in FIG. 12, a solid-state imaging device includes a solid-state image sensing element chip 81, an epoxy resin sheet 84 having an opening portion 83 formed only in a photo acceptance unit (not shown) adhered on the solid-state image sensing element chip 81 with an adhesive agent 85, and a transparent member 86 adhered on the epoxy resin sheet 84 with the adhesive agent 85 and serving as a flat plate portion. The solid-state image sensing element chip 81 is die-bonded to a package or substrate 810, and certain couplings between a pad portion 81a of the solid-state image sensing element chip 81 and the package or substrate 810 are made by bonding wires 811 to achieve a practical use thereof, and then peripheral portions thereof including bonding wire-coupling portions except hermetic seals are packaged with an encapsulating resin 812. A transparent member 86 functions as a protective film for a photo acceptor.

FIG. 13, 14 are cross-sectional views, illustrating a solid-state imaging device described in Japanese Patent Laid-Open No. H07-202,152 (1995). As shown in FIG. 13, a solid-state imaging device includes a solid-state image sensing element chip 91, in which only a photo acceptance area 92 provided with a micro lens 93 is hermetically sealed with a transparent encapsulating member 94. The solid-state image sensing element chip 91 is directly adhered onto a substrate 921 by a die-bonding, and after the electrodes of the solid-state image sensing element chip 91 is connected to the electrodes of the substrate 921 by the bonding wires 922, the chip surfaces except the transparent encapsulating member 94 provided only in the photo acceptance area 92 of the solid-state image sensing element chip 91 and the coupling portions with the bonding wires 922 are encapsulated with the encapsulating resin 923. As shown in FIG. 14, the transparent encapsulating member 911 includes a flat plate portion 911a and a frame 911b and is configured to form the flat plate portion 911a on the upper surface of the frame 911b. The transparent encapsulating member 911 provides a protection of the photo acceptance area 92, and the flat plate portion 911a functions as a protective film. A transparent encapsulating member 911 shown in FIG. 14 corresponds to the transparent encapsulating member 94 shown in FIG. 13.

Besides, the upper surface of the encapsulating resin 812 is located to be higher than the upper surface of the epoxy resin sheet 84 in the solid-state imaging device described in reference to FIG. 12. Therefore, the side surfaces of the transparent member 86 formed on the epoxy resin sheet 84 are covered with the encapsulating resin 812. This provides an adhesion of the side surface of the transparent member 86 with the encapsulating resin 812, and thus stripping of the transparent member 86 is difficult.

In the solid-state imaging device described in reference to FIGS. 13 and 14, the upper surface of the encapsulating resin 923 is located to be higher than the upper surface of the frame 911b. Since the side surface of the transparent encapsulating member 94 is covered with the encapsulating resin 923 as shown in FIG. 13, the side surface of the flat plate portion 911a shown in FIG. 14 is covered with the encapsulating resin 923 (not shown). This causes an adhesion of the side surface of the flat plate portion 911a with the encapsulating resin 923, causing a difficulty in stripping the flat plate portion 911a. In addition, since the dimensional area of a surface for adhesion of the flat plate portion 911a is limited by the dimensional area of the upper surface of the frame 911b, it is difficult to provide an increased dimensional area for adhesion to achieve higher adhesive force.

SUMMARY

According to one aspect of the present invention, there is provided an electronic device, comprising: an element; a frame member composed of a first resin provided so as to surround a functional unit of the element; and a resin layer composed of a second resin and filling a periphery of the frame member, wherein the functional unit of the element is exposed in a space surrounded by the frame member, and wherein an upper surface of the frame member and an upper surface of the resin layer form a common plane, or the upper surface of the frame member is located to be higher than the upper surface of the resin layer.

In such electronic device, the upper surface of the frame member and the upper surface of the resin layer are coplanar, or the upper surface of the frame member is located to be higher than the upper surface of the resin layer. More specifically, attaching and removing of the protective film that covers the upper surface of frame member and the upper surface of the resin layer can be facilitated, so that a reduced contamination in the functional unit can be achieved, providing an electronic device with an improved reliability.

According to another aspect of the present invention, there is provided an electronic device, comprising: an element; a frame member composed of a first resin provided so as to surround a functional unit of the element; and a resin layer composed of a second resin and filling a periphery of the frame member, wherein the functional unit of the element is exposed in a space surrounded by the frame member, and wherein an upper surface of the frame member is located to be higher than an upper surface of the resin layer.

In such electronic device, the upper surface of the frame member is located to be higher than the upper surface of the resin layer. More specifically, attaching and removing of the protective film that covers the upper surface of frame member and the upper surface of the resin layer can be facilitated, so that a reduced contamination in the functional unit can be achieved, providing an electronic device with an improved reliability.

According to further aspect of the present invention, there is provided a method for manufacturing an electronic device, including: forming a resin film over a wafer, which has a plurality of elements formed therein; patterning the resin film to form a frame member, which is composed of a first resin and is provided to surround a functional unit of the element; and providing an encapsulation, comprising: installing the element over a base member; pressing molding surfaces of encapsulating metal molds against an upper surface of the frame member and a lower surface of the base member, respectively; and injecting a second resin into portions of spaces surrounded by the molding surface of the encapsulating metal mold except the portion surrounded by the frame member to fill a periphery of the frame member.

Since the molding surface of the encapsulating metal mold is pressed against the upper surface of the frame member and the lower surface of the base member, and the second resin is injected into portions of spaces surrounded by the molding surface of the encapsulating metal mold except the portion surrounded by the frame member to fill a periphery of the frame member in such method for manufacturing the electronic device, the upper surface of the frame member and the upper surface of the resin layer are formed to be coplanar. This allows easy attaching and removing of the protective film that covers the plane formed of the upper surface of frame member and the upper surface of the resin layer can be facilitated, so that a reduced contamination in the functional unit can be achieved, providing an electronic device with an improved reliability. This provides the electronic device with an improved reliability by a simple process.

According to the present invention, an electronic device can be provided with an improved reliability and a reduced contamination in a functional unit of an exposed element, and a method for manufacturing thereof is also provided.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Exemplary implementations for electronic devices and methods for manufacturing thereof according to the present invention will be described in detail as follows in reference to the annexed figures. In all figures, an identical numeral is assigned to an element commonly appeared in the figures, and the detailed description thereof will not be repeated.

First Embodiment

Figure 1A:
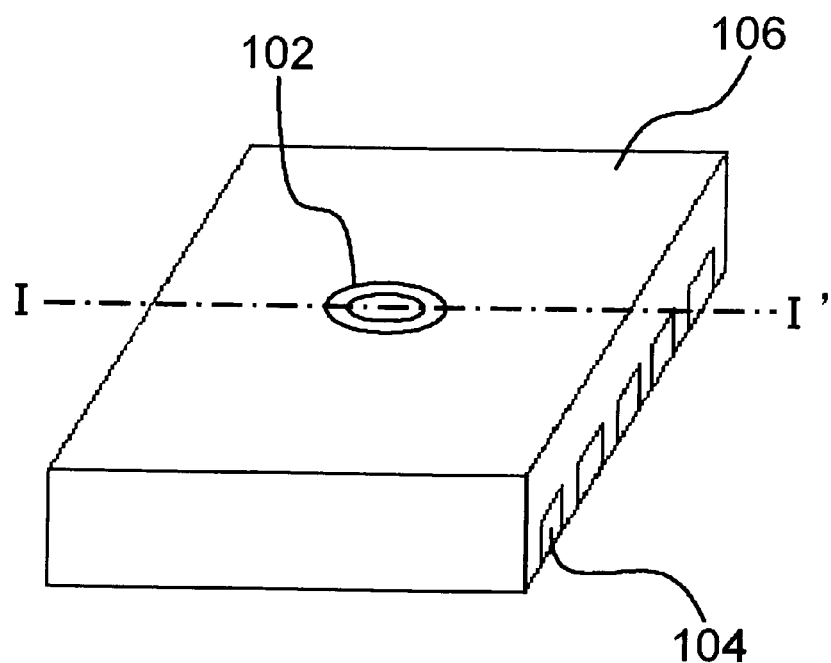
FIG. 1A is a perspective view, illustrating an electronic device in first embodiment.
Figure 1B:
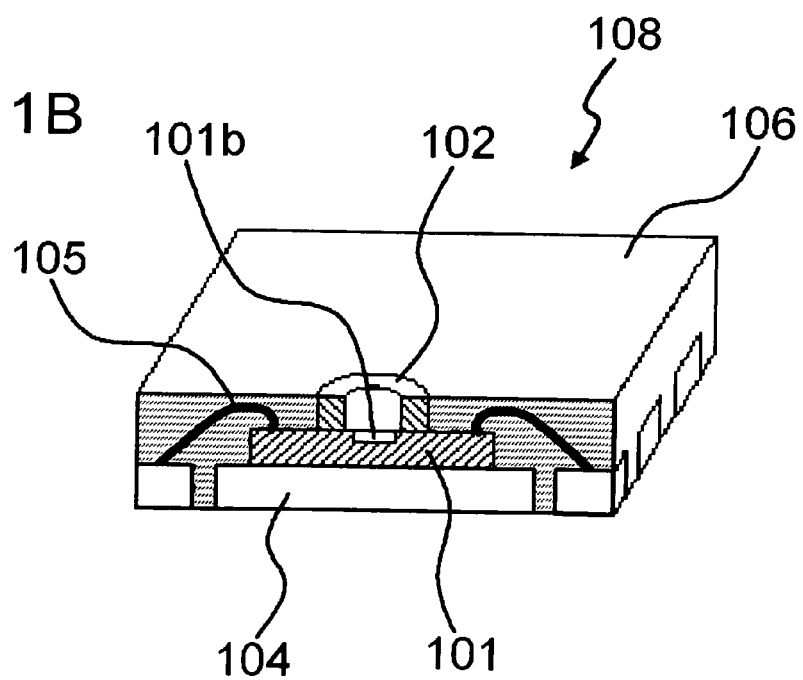
FIG. 1B is a cross-sectional view of the electronic device shown in FIG. 1A along line I-I'.

FIG. 1A is a perspective view, illustrating an electronic device in first embodiment of the present invention, and FIG. 1B is a cross-sectional view, broken along line I-I' in FIG. 1A.

As shown in FIG. 1B, an electronic device 108 includes a light receiving element 101, a frame member 102 composed of a first resin provided so as to surround a photo acceptor unit 101b (functional unit) of the light receiving element 101, and an encapsulating resin layer 106 composed of a second resin and filling a periphery of the frame member 102. Though it is not shown in FIG. 1B, the electronic device 108 further includes a protective film that covers a plane formed by an upper surface of the frame member 102 and an upper surface of the encapsulating resin layer 106. Further, a light receiving element 101 is electrically coupled to lead frames 104 through metal filaments 105.

The upper surface of the frame member 102 and the upper surface of the encapsulating resin layer 106 form a common plane. More specifically, since the upper surface of the frame member 102 and the upper surface of the encapsulating resin layer 106 are coplanar, an adhesion and a stripping of a protective film that covers the upper surface of the frame member 102 and the upper surface of the encapsulating resin layer 106 can be easily presented.

A photo acceptor unit 101b serving as a functional unit is formed in the surface of the light receiving element 101. More specifically, the photo acceptor unit 101b is exposed in the surface of the light receiving element 101.

The frame member 102 is formed on the light receiving element 101, and is provided so as to surround the photo acceptor unit 101b. The photo acceptor unit 101b of the light receiving element 101 is exposed in a space surrounded by the frame member 102.

A height of the frame member 102 is designed to be 0.08 mm. Preferable height of the frame member 102 may be equal to or larger than 0.05 mm, and more preferably equal to or larger than 0.1 mm. Such range of the height provides prevention from a contact of the metal filament 105 coupled between the lead frame 104 and the predetermined position of the light receiving element 101 with encapsulating metal molds 111a and 111b that are employed in the manufacturing process for the electronic device 108 (see FIG. 4A). Therefore, the encapsulating metal mold 111a can be strongly adhered to the upper surface of the frame member 102, preventing the encapsulating resin layer 106 from a permeation into the inside of the frame member 102. Here, the height of the frame member 102 may be determined as a vertical length from the upper surface of the light receiving element 101 to the upper surface of the frame member 102, and equivalent to a thickness of the resin film composed of the first resin.

Preferable elastic modulus of the frame member 102 may be within a range of from 1 GPa to 6 GPa at 20 degree C. and within a range of from 10 MPa to 3 GPa at 200 degree C. The range of from 1 GPa to 6 GPa at 20 degree C. provides a function of the frame member 102 as protecting the photo acceptor unit 101b of the electronic device 108. The range of from 10 MPa to 3 GPa at 200 degree C. provides a function of the frame member 102 as a cushioning material, as the frame member 102 is elastically slightly deformed when the frame member 102 is pressed to the encapsulating metal molds 111a and 111b in the process for manufacturing the electronic device 108, so that the photo acceptor unit 101b is protected from the external pressure. Here, the elastic modulus of the frame member 102 means an elastic modulus in the condition that the first resin is completely cured with a light and a heat.

The frame member 102 is formed of the first resin. The first resin is a cured product of a resin material that is curable by a light and a heat. The resin materials that are curable by a light and a heat include photo-reactive resins such as acrylic resins and heat-reactive resins such as epoxy resins.

The encapsulating resin layer 106 is formed of the second resin. The second resin is an encapsulating resin that is employed for encapsulating the electronic device 108. The upper surface of the frame member 102 and the upper surface of the encapsulating resin layer 106 totally form a flat surface.

A method for manufacturing the electronic device in first embodiment will be described in reference to FIG. 2A to FIG. 6B. FIG. 2A to FIG. 5C are cross-sectional views, illustrating a process for manufacturing the electronic device in first embodiment. FIG. 6A is a perspective view, illustrating the electronic device in first embodiment, and FIG. 6B is a cross-sectional view broken along line II-II' in FIG. 6A.

Figure 2A:
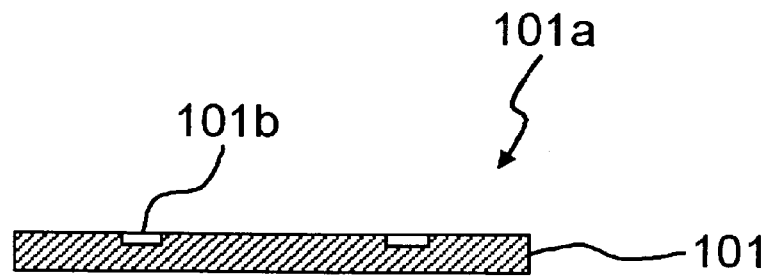
FIGS. 2A to 2D are cross-sectional views, illustrating a process for manufacturing the electronic device in first embodiment.

First of all, as shown in FIG. 2A, the wafer 101a is prepared. Such wafer 101a includes a plurality of light receiving elements 101 formed therein, and the photo acceptor units 101b are exposed over the surface of the light receiving element 101. Here, among the light receiving elements 101 arranged in the wafer 101a, only two light receiving elements 101 are illustrated in FIG. 2A, and thus only two photo acceptor units 101b are exposed.

Figure 2B:
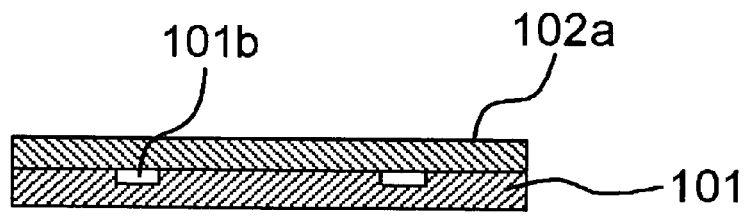

Next, as shown in FIG. 2B, the resin film 102a (first resin) is formed on the light receiving element 101 (wafer 101a). Here, the resin film 102a is a film having a uniform thickness distribution. The reason for employing such film-form resin film 102a is to form a resin film having a uniform film thickness of 0.05 mm or thicker over the entire wafer 101a. More specifically, a lower viscosity resin should be employed for obtaining uniform thickness of the film over the entire wafer 101a in a case that a liquid resin is employed for the resin film 102a, which leads to a difficulty in obtaining a sufficient film thickness of 0.05 mm due to its lower viscosity. On the contrary, a formation of a film having a thickness of 0.05 mm or larger over the entire wafer 101a with a liquid resin requires a use of a higher viscosity resin, which leads to an increased viscous resistance during the process for coating thereof over the wafer 101a due to its higher viscosity, causing an increased variation in the thickness of the coated film, such that it is difficult to obtain a uniform film thickness. Consequently, the use of the film-form resin film 102a achieves forming the resin film 102a with a uniform film thickness of 0.05 mm or thicker. In the present embodiment, the entire wafer 101a is covered with the resin film 102a. The thickness of the resin film 102a is 0.08 mm. This configuration allows obtaining the frame member 102 having the height of 0.08 mm.

Figure 2C:
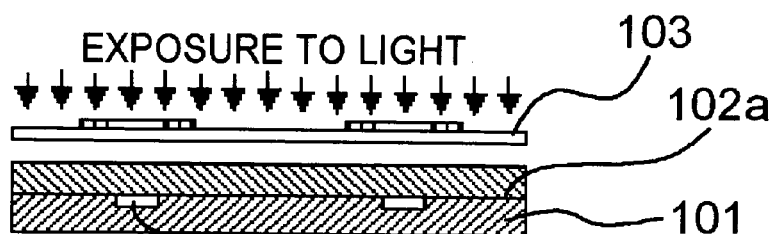

Subsequently, as shown in FIG. 2C, an alignment is performed so that the photo acceptor unit 101b is disposed within an inner diameter of a cylindrical portion formed in the upper surface of the exposure mask 103, and then an exposure is performed to pattern the resin film 102a so as to form the frame member 102.

Figure 2D:
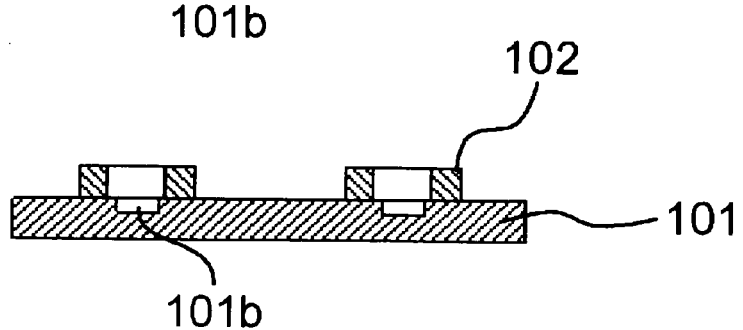

Further, as shown in FIG. 2D, a developing process is performed to remove portions of the resin film 102a except the frame members 102, so that the frame members 102 is formed so as to surround the photo acceptor units 101b. As described above, the frame members 102 can be formed by using a photolithographic process. Thus, a contact of the encapsulating resin layer 106 against the photo acceptor unit 101b is completely eliminated, thereby preventing the encapsulating resin layer 106 from remaining in the inside of the frame member 102. In addition to above, the resin composing the frame member 102 is not completely cured just after the developing process is completed, providing a weak adhesion between the frame member 102 and the wafer 101a or in other words between the frame member 102 and the light receiving elements 101 with a weak adhesion force, and not providing a firm adhesion.

Subsequently, the frame member 102 having the wafer 101a thereon is thermally processed to completely cure the frame member 102, providing a firm adhesion the frame member 102 and the wafer 101a or in other words between the frame member 102 and the light receiving elements 101. Since no geometric change is caused in the frame member 102 by such thermal processing, the geometry of the frame member 102 is similar to the geometry of the frame member 102 shown in FIG. 2D.

Figure 3A:
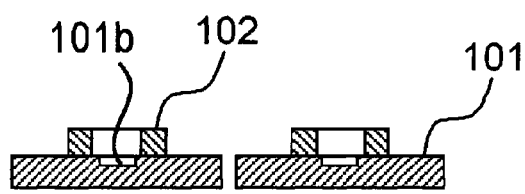
FIGS. 3A to 3C are cross-sectional views, illustrating the process for manufacturing the electronic device in first embodiment.

Subsequently, as shown in FIG. 3A, the individual light receiving elements 101 are diced out from the wafer 101a to obtain the light receiving elements 101 having the frame members 102.

As shown in FIG. 6A, the frame member 102 is formed to form a cylindrical shape having a hollow portion in the inside of the frame member. Here, the available geometry of the frame member 102 is not limited to a cylindrical geometry, and other column or prism such as an elliptical column or a square pole may alternatively be employed so as to form a frame around the photo acceptor unit 101b, depending on the geometry of the photo acceptor unit 101b. Further, since the upside of the photo acceptor unit 101b is provided with a hollow portion in the inside of the frame member 102 as shown in FIG. 6B, the photo acceptor unit 101b is exposed in the surface of the light receiving element 101. Here, an elastic modulus of the frame member 102 is controlled to be about 2.4 GPa at an ambient temperature, and about 15 MPa at a temperature of 200 degree C. The elastic modulus of the frame member 102 may be appropriately adjusted by suitably selecting a type of the resin material that is curable by a light and a heat or a content ratio of added agents such as a curing agent and the like, or a process conditions such as a curing light intensity or a curing temperature.

Figure 3B:
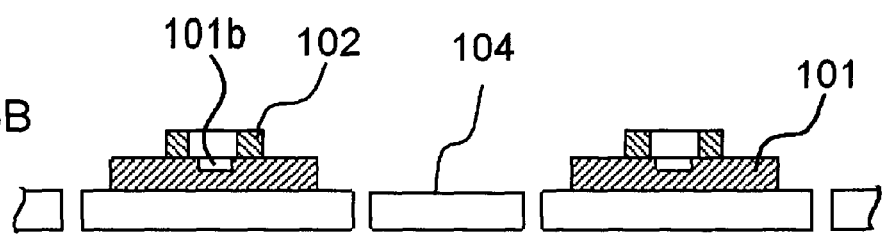
Figure 3C:
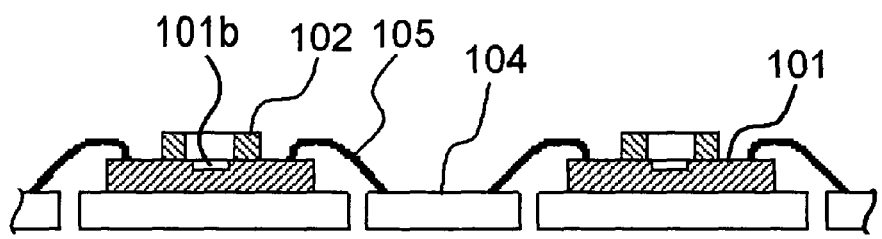

Subsequently, as shown in FIG. 3B, the light receiving element 101 is adhered in a predetermined position on the lead frame 104 by an adhesive agent. Subsequently, as shown in FIG. 3C, the light receiving elements 101 are electrically coupled to the associated lead frames 104 in respective predetermined positions by metal filaments 105.

Figure 4A:
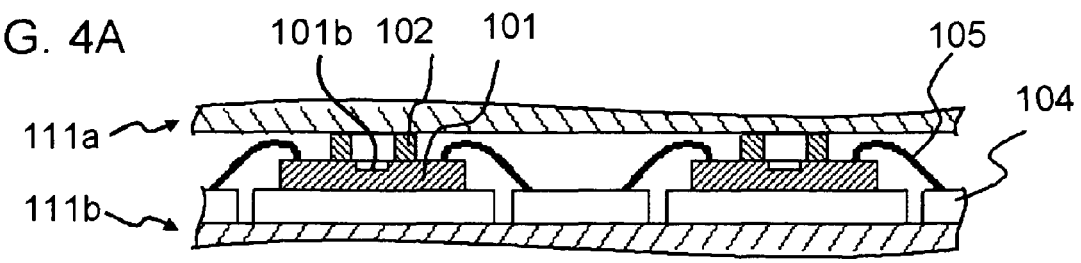
FIGS. 4A and 4B are cross-sectional views, illustrating the process for manufacturing the electronic device in first embodiment.
Figure 4B:
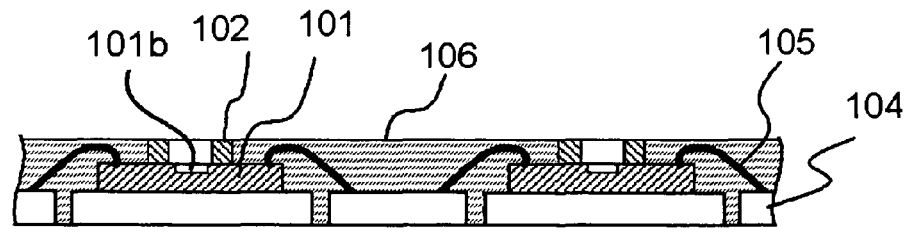

Subsequently, as shown in FIG. 4A, encapsulating metal molds 111a and 111b having flat molding surfaces are prepared, and then the light receiving elements 101 on the lead frame 104 shown in FIG. 4B are fixed in predetermined positions of the encapsulating metal mold 111a and 111b. Subsequently, the molding surface of the encapsulating metal mold 111a compressively contacts with the upper surface of the frame member 102, and the molding surface of the encapsulating metal mold 111b compressively contacts with the lower surface of the lead frame 104. More specifically, a gap between the upper surface of the frame member 102 and the molding surface of the encapsulating metal mold 111a and a gap between the lower surface of the lead frame 104 and the molding surface of the encapsulating metal mold 111b are reduced to be minimum, providing close contacts therebetween.

Subsequently, as shown in FIG. 4A, staying at the condition of the compressive-contact, an encapsulating resin melted by a heat (second resin) is injected in spaces surrounded by the molding surfaces of the encapsulating metal molds 111a and 111b except the space surrounded by the frame member 102. This achieves forming the encapsulating resin layer 106 filling the periphery of the frame member 102. Here, an enclosed region surrounded by the frame member 102 and the encapsulating metal mold 111a is formed in the upside of the photo acceptor unit 101b. Further, the molding surface of the encapsulating metal mold 111a and the upper surfaces of the frame member 102 are closely contacted with an external force by a clamping pressure, and the light receiving element 101 and the frame member 102 are strongly adhered as described above. In such case, if the frame member 102 has an elastic modulus within a range of from 1 GPa to 6 GPa at 20 degree C. and within a range of from 10 MPa to 3 GPa at 200 degree C., the frame member 102 itself can be suitably elastically-deformed by a clamping pressure of the encapsulating metal mold to absorb the external force of such clamping pressure, thereby providing a protection for the light receiving element 101. Further, such elastic deformation may also create an opposing force for closely contacting the frame member 102 against the encapsulating metal mold 111a. Thus, an unwanted flow of the encapsulating resin into the interior of the frame member 102 or in other words into the enclosed region formed in the upside of the photo acceptor unit 101b can be prevented. In order to provide an increased adhesive force of the encapsulating metal mold 111a by the elastic deformation of the frame member 102 as described above, the design may be presented so that the height of the upper surface of the frame member 102 from the upper surface of the encapsulating resin layer 106 is within a range of from 0 mm to 0.05 mm. When the upper surface of the frame member 102 is designed to be higher than the upper surface of the encapsulating resin layer 106 by 0.05 mm or larger, the external force due to the clamping pressure of the encapsulating metal mold 111a is increased, a deformation of the frame member 102 may lead to a plastic deformation, causing a break of the frame member 102. On the contrary, if the upper surface of the frame member 102 is lower than the upper surface of the encapsulating resin layer 106, or in other words, if the height of the upper surface of the frame member 102 is lower than the height of the upper surface of the encapsulating resin layer 106 (lower than 0 mm level), causing an unwanted flow of the encapsulating resin has in the inside of the frame member 102.

Subsequently, the encapsulating metal molds 111a and 111b are removed to obtain the light receiving element 101, in which the level of the upper surface of the frame member 102 is the same as the level of the upper surface of the encapsulating resin 106, as shown in FIG. 4B. More specifically, a plurality of light receiving elements 101 on the lead frame 104 are totally encapsulated.

Figure 5A:
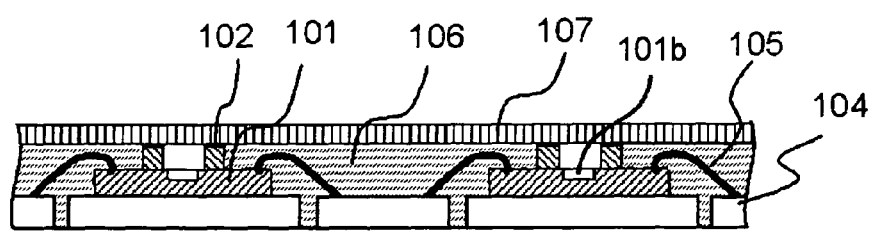
FIGS. 5A to 5C are cross-sectional views, illustrating the process for manufacturing the electronic device in first embodiment.
Figure 6A:
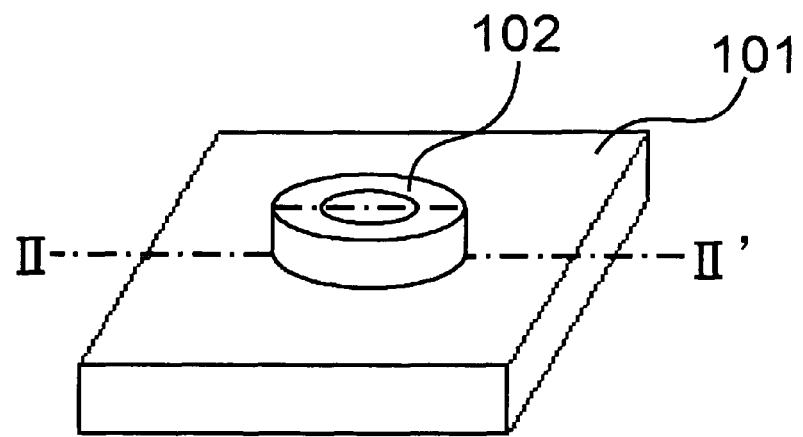
FIG. 6A is a perspective view, illustrating another electronic device in first embodiment.
Figure 6B:
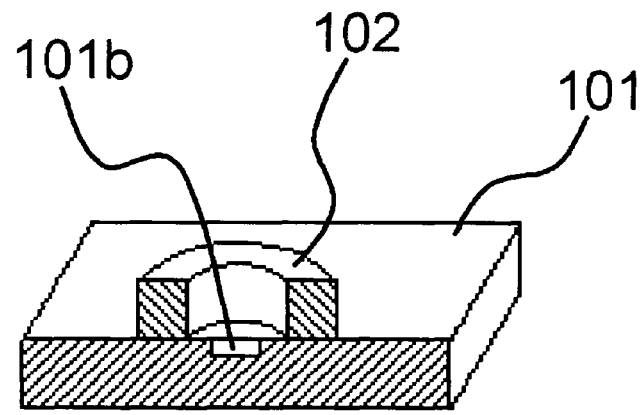
FIG. 6B is a cross-sectional view of the electronic device shown in FIG. 6A along line II-II'.

Subsequently, as shown in FIG. 5A, a protective tape 107 is formed to cover the upper surface of the frame member 102 and the upper surface of the encapsulating resin layer 106. The protective tape 107 serves as protecting the photo acceptor units 101b. Although the material for the protective tape 107 are not particularly limited to any specific material, a strippable resin having a heat resistance at a temperature of not lower than its reflow temperature may be typically employed.

Figure 5B:
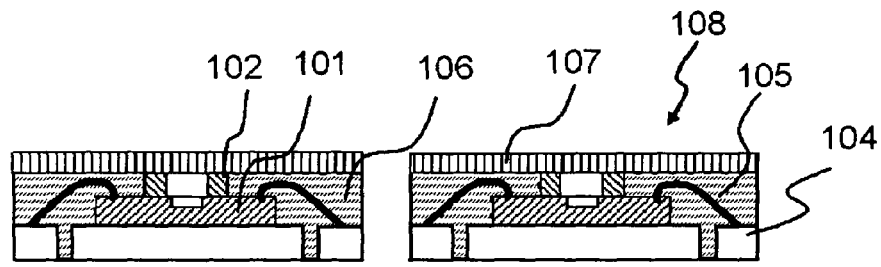
Figure 5C:
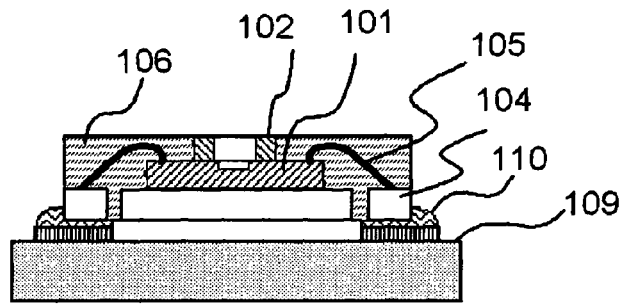

Subsequently, as shown in FIG. 5B, a dicing into the respective light receiving elements 101 is performed to obtain the electronic device 108 having the desired geometry.

Then, the electronic device 108 is coupled to the base substrate 109 having the essential electric circuits formed therein by a solder 110 with a reflow process. The protective tape 107 is then removed to obtain the electronic device 108 having the installed devices FIG. 5C.

Here, the electronic device 108 is a device having a passive element and/or an active element formed on the surface of the semiconductor substrate or the glass substrate.

Advantageous effects obtainable by employing the configuration of the present embodiment will be described. The electronic device 108 is configured to have the upper surface of the frame member 102 and the upper surface of encapsulating resin layer 106, both of which form a common plane. According to electronic device 108 having such configuration, easy adhesion and removal of the protective tape 107 that covers the upper surface of the frame member 102 and the upper surface of the encapsulating resin layer 106 can be achieved. Therefore, a contamination in the photo acceptor unit 101b can be reduced. Since the protective tape 107 disposed on the optical path of the exposed photo acceptor unit 101b can be easily eliminated in the use of the electronic device 108, an attenuation of the optical signal can be prevented. Thus, the electronic device 108 having an improved reliability can be achieved.

Further, the protective tape 107 is removed after the electronic device 108 is coupled to the base substrate 109 in the process for manufacturing the electronic device 108. Therefore, a contamination in the photo acceptor unit 101b by the contaminants entered into the inside of the frame member 102 can be inhibited during the installation of the electronic device 108 onto the base substrate 109.

In the method for manufacturing of electronic device 108 includes the flat molding surfaces of the encapsulating metal mold 111a and 111b are pressed against the upper surface of the frame member 102 and the lower surface of the lead frame 104, and the encapsulating resin is injected into the spaces surrounded by the molding surfaces of the encapsulating metal molds 111a and 111b except the space surrounded by the frame member 102 to form the encapsulating resin layer 106 that fills the periphery of the frame member 102. Therefore, the structure, in which the upper surface of the frame member 102 and the upper surface of the encapsulating resin layer 106 form a common plane, can be obtained by a simple process. Thus, an improved productivity of the electronic devices 108 can be achieved.

Further, the use of the resin film 102a having uniform thickness distribution can provide the frame member 102 having the uniform height distribution over the entire surface of the wafer 101a. This allows reducing the variation in the height of the frame member 102 on the light receiving element 101, and providing the encapsulating in one process. Thus, an improved productivity of the electronic devices 108 can be achieved.

Further, the frame member 102 provides a protection for the photo acceptor units 101b in the process for manufacturing the electronic device 108, and the removal of the frame member 102 after the production of the electronic device 108 is not required. Therefore, an additional operation for removing the frame member 102 can be omitted, so that the electronic device 108 exhibiting an improved reliability can be obtained without a need for conducting additional manufacturing processes.

While the exemplary implementation of the resin film 102a having the thickness of 0.08 mm is shown in the present embodiment, the thickness of the resin film 102a may be suitably selected, and the height of the frame member 102 may be selected to be equal to or larger than 0.08 mm, and more preferably thicker resin film 102a of 0.1 mm or thicker may be employed. In addition, while the exemplary implementation employing a single layer of the resin film 102a is illustrated in the present embodiment, the resin film 102a may include any number of layers.

Second Embodiment

Figure 7A:
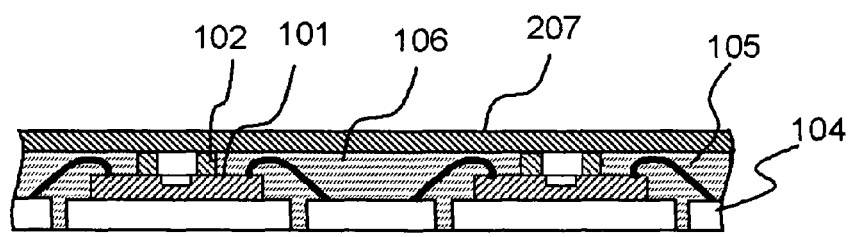
FIGS. 7A to 7C are cross-sectional views, illustrating a process for manufacturing the electronic device in second embodiment.
Figure 7B:
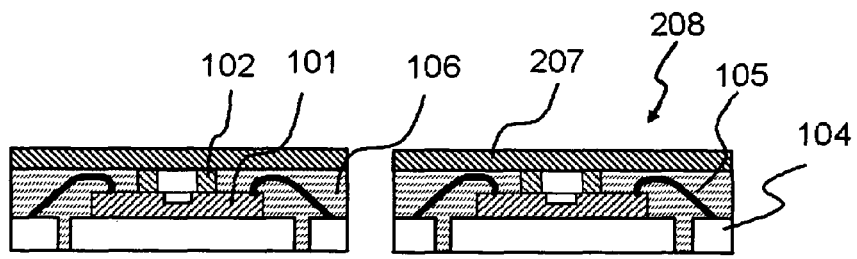
Figure 7C:
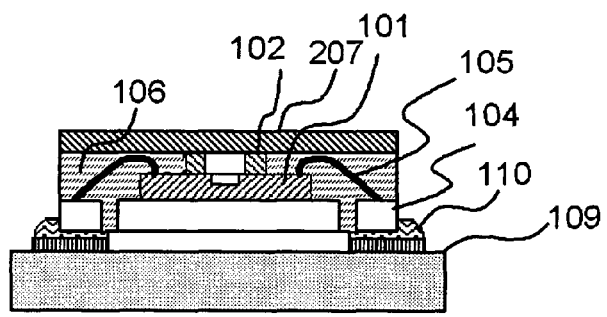

FIGS. 7A to 7C are cross-sectional views, illustrating a manufacturing process for an electronic device in second embodiment. While first embodiment is configured to adopt the protective tape 107, the present embodiment is configured to adopt a protective glass 207. Other configurations of the present embodiment are similar to that employed in first embodiment.

The protective glass 207 is formed on a plane commonly formed by the upper surface of the frame member 102 and the upper surface of the encapsulating resin layer 106. An optically transparent glass may be employed for the protective glass 207.

In the process for manufacturing the electronic device 208 having such configuration, the similar manufacturing process operations shown in FIG. 2A to FIG. 4B for manufacturing the electronic device 108 in the previous embodiment may also employed. Here, manufacturing process operations after the operations shown in FIG. 2B will be described.

First of all, as shown in FIG. 7A, the protective glass 207 is adhered to cover the upper surface of the frame member 102 and the upper surface of the encapsulating resin layer 106. Here, the adhesion of the protective glass 207 is achieved with an adhesive agent having a heat resistance at a temperature of not lower than its reflow temperature. Next, as shown in FIG. 7B, each of a plurality of electronic devices 208 formed on the lead frame 104 is diced out to obtain the electronic devices 208 having desired geometry. Next, as shown in FIG. 7C, the electronic device 208 is coupled to the base substrate 109 having the essential electric circuits formed therein by a solder 110 with a reflow process, and then is installed.

Since the optically transparent glass is employed for the protective glass 207 for the electronic device 208 in second embodiment, an advantageous effect of eliminating unwanted operation for stripping the protective glass 207 after the end of the reflow operation can be provided.

The present embodiment is also configured that the upper surface of the frame member 102 and the upper surface of the encapsulating resin layer 106 form a common plane, so that the electronic device 208 that is easily provided with the protective glass 207 adhered thereon, and the process for manufacturing thereof, can be achieved. Other advantageous effects of the present embodiment are similar to that obtained in the above-described embodiment.

Third Embodiment

FIGS. 8A to 8D are cross-sectional views, illustrating a process for manufacturing an electronic device in third embodiment. The configuration of the electronic device in third embodiment is similar to that of the electronic device 108 in first embodiment.

The frame member 302 of the electronic device in third embodiment is formed by the manufacturing process as shown in FIGS. 8A to 8D. Other manufacturing process operations in this embodiment are similar to the operations in first embodiment. FIG. 8A to FIG. 8D correspond to FIG. 2A to FIG. 2D, respectively. Other manufacturing process operations are similar to the operations in first embodiment, and thus the detailed description thereof is not repeated.

Figure 8A:
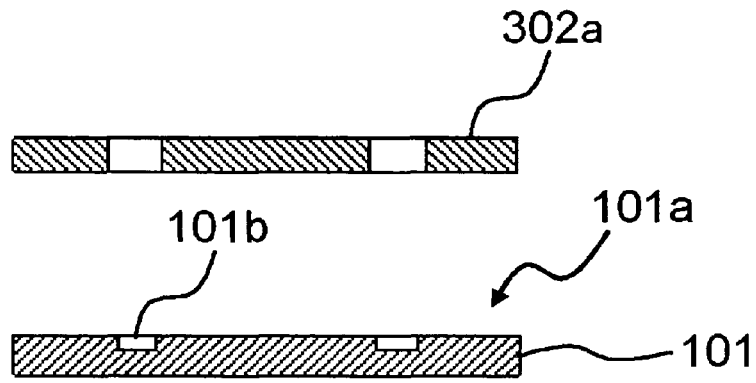
FIGS. 8A to 8D are cross-sectional views, illustrating a process for manufacturing the electronic device in third embodiment.
Figure 8B:
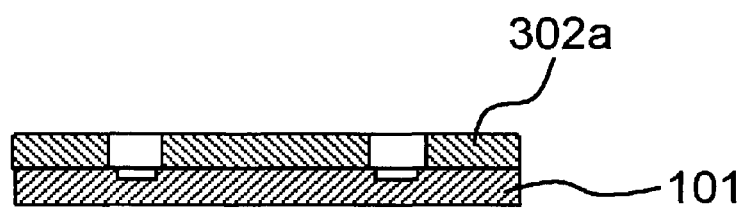

First of all, as shown in FIG. 8A, a wafer 101a having a plurality of light receiving elements 101 formed therein is prepared. The photo acceptor units 101b are exposed in the surfaces of respective light receiving elements 101 arranged in the wafer 101a. Here, among a plurality of light receiving elements 101 arranged in the wafer 101a, only two light receiving elements 101 are illustrated in FIG. 8A. In addition, a resin film 302a formed to have a film-form and composed of a resin material that is curable by a light and a heat is prepared. Openings corresponding to the hollow sections of the frame member 302 are previously bored in the resin film 302a. Next, as shown in FIG. 8B, an alignment for the photo acceptor units 101b is performed to be suitably positioned in the inside of the opening provided in the resin film 302a, and then the entire light receiving element 101 (wafer 101a) is covered with the resin film 302a.

Figure 8C:
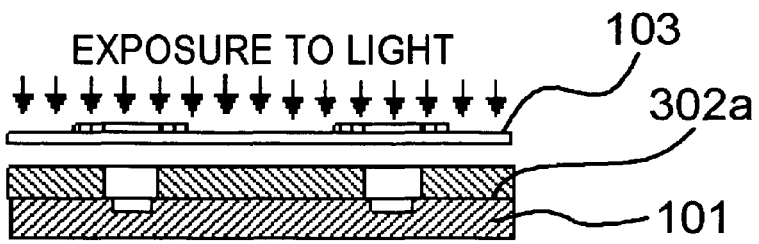

Then, as shown in FIG. 8C, an exposure process is performed by employing an exposure mask 103 to pattern the resin film 302a so as to form the frame member 302.

Figure 8D:
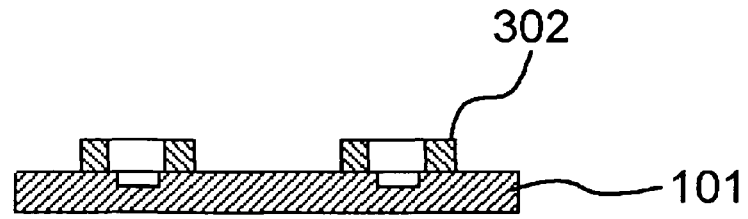

Further, as shown in FIG. 8D, a developing process is performed to remove the resin film 302a except the frame members 302, so that the frame members 302 provided to surround the respective photo acceptor units 101b are formed. As described above, the frame member 302 can be formed by employing a photolithographic process. In addition to above, the resin composing the frame member 302 is not completely cured just after the developing process is completed, providing a weak adhesion between the frame member 302 and the light receiving elements 301 with a weak adhesion force, and not providing a firm adhesion.

So that an inner hollow portion of frame member 302 is previously formed, a residue of the resin film 302a inside of the frame member 302, which is otherwise difficult to be completely eliminated by only the developing process, can be prevented. Therefore, a contamination in the photo acceptor unit 101b can be further inhibited, and thus the electronic device 108 exhibiting a further improved reliability and the method for manufacturing thereof can be achieved. While the manufacturing process, in which the inner wall and the external wall of the frame member 102 are simultaneously formed, is difficult to form the inner wall of the frame member 102 as being perpendicular to the surface of the light receiving element 101 as described in first embodiment, the use of the frame member 302 as described in third embodiment can provide a formation of the inner wall of the frame member 302 as being perpendicular to the surface of the light receiving element 101, by previously forming the openings in the resin film 302a. Thus, the distance between the photo acceptor unit 101b and the frame member 302 can be reduced, thereby further reducing a contamination in the photo acceptor unit 101b. In addition, further advantageous effect of allowing a reduction in the size of the electronic device is also achieved.

In the present embodiment, the configuration of the electronic device is also similar to that of first embodiment. Other advantageous effects of the present embodiment are similar to that obtained by the above-described embodiment.

Fourth Embodiment

Figure 9A:
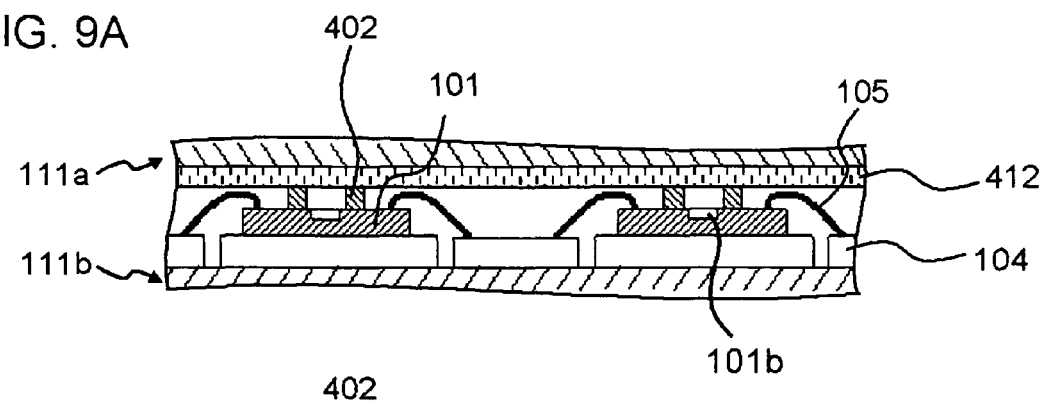
FIG. 9A and FIG. 9B are cross-sectional views, illustrating a process for manufacturing the electronic device in fourth embodiment.
Figure 9B:
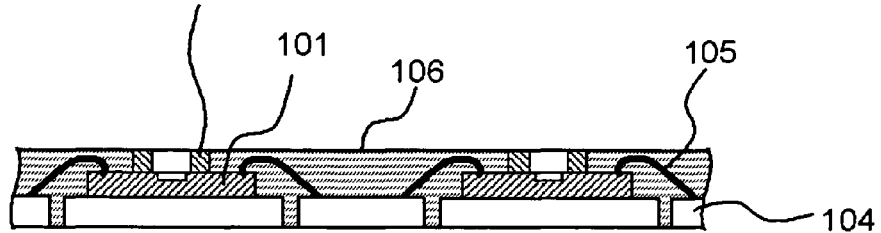

FIGS. 9A and 9B are cross-sectional views, illustrating a process for manufacturing an electronic device in fourth embodiment. Configuration of the electronic device in fourth embodiment is similar to that for the electronic device 108 in first embodiment. The electronic device in fourth embodiment is formed by the manufacturing process that is illustrated in FIGS. 9A and 9B. Other manufacturing process operations in this embodiment are similar to the operations in first embodiment. FIGS. 9A and 9B correspond to FIGS. 4A and 4B, respectively. Other manufacturing process operations are similar to the operations in first embodiment, and thus the detailed description thereof is not repeated.

First of all, as shown in FIG. 9A, encapsulating metal molds 111a and 111b having flat molding surfaces are prepared, and then a resin film 412 is put on the molding surface of the encapsulating metal mold 111a by a vacuum chucking. Successively, the light receiving elements 101 on the lead frame 104 are fixed in predetermined positions of the encapsulating metal mold 111a and 111b. Next, the molding surface of the encapsulating metal mold 111a compressively contacts with the upper surface of the frame member 402, and the molding surface of the encapsulating metal mold 111b compressively contacts with the lower surface of the lead frame 104. More specifically, the resin film 412 is disposed and pressed between the upper surface of the frame member 402 and the molding surface of the encapsulating metal mold 111a.

This allows reducing a gap between the upper surface of the frame member 402 and the molding surface of the encapsulating metal mold 111a and a gap between the lower surface of the lead frame 104 and the molding surface of the encapsulating metal mold 111b to be minimum by interposing the resin film 412, providing close contacts therebetween.

Subsequently, as shown in FIG. 9B, staying at the condition of the compressive-contact, an encapsulating resin melted by a heat is injected in spaces surrounded by the molding surfaces of the encapsulating metal molds 111a and 111b except the space surrounded by the frame member 102 to form an encapsulating resin layer 106 that fills the periphery of the frame member 402. Here, an enclosed region surrounded by the frame member 402 and the encapsulating metal mold 111a is formed in the upside of the photo acceptor unit 101b. Further, the molding surface of the encapsulating metal mold 111a and the upper surfaces of the frame member 402 are closely contacted with an external force by a clamping pressure, and the light receiving element 101 and the frame member 402 are strongly adhered as described above. Thus, an unwanted flow of the encapsulating resin into the interior of the frame member 402 or in other words into the enclosed region formed in the upside of the photo acceptor unit 101b can be prevented.

Subsequently, the encapsulating metal molds 111a and 111b are removed to obtain the light receiving element 101 as shown in FIG. 9B. More specifically, a plurality of light receiving elements 101 on the lead frame 104 are totally encapsulated. Since the resin film 412 is chucked to the encapsulating metal mold 111a in such occasion, the film is not remained on the upper surface of the frame member 402 or on the upper surface of the encapsulating resin layer 106.

In the present embodiment, an elastic modulus of the frame member 402 is 9 GPa. Therefore, an improved stiffness of the frame member 402 is achieved to provide a further strengthened protection for a permeation of the encapsulating resin into the hollow portion in the frame member 402, providing a further improved protection for the photo acceptor unit 101b.

When the elastic modulus of the frame member 402 of equal to or higher than 6 GPa is employed without employing the configuration of the present embodiment, a sufficient elastic deformation of the frame member 402 cannot possibly be presented against a direct clamp-pressurizing for the upper surface of the frame member 402 with the encapsulating metal mold 111a as described above, so that it is possible to exert an external force generated by the clamping pressure over the light receiving element 101. This may cause a breakdown of the light receiving element 101, impairing the function of the photo acceptor unit 101b, and further possibly causing deterioration in environmental tests. On the contrary, since the resin film 412 is interleaved between the upper surface of the frame member 402 and the molding surface of the encapsulating metal mold 111a in the present embodiment, the resin film 412 functions as a cushioning material, so that defective situations typically as a breakdown of the light receiving element 101 or a disturbance of the function of the photo acceptor unit 101b can be avoided.

Since the available range of the elastic modulus of the frame member 402 is equal to or higher than 6 GPa, a degree of flexibility in selecting a resin for the first resin as a material of the frame member 402 can be increased. Further advantage is that an increased stiffness of the frame member 402 can be presented since the frame member 402 is composed of the material of the resin having the elastic modulus of the completely cured resin of 9 GPa, so that a further strengthened protection for a permeation of the encapsulating resin into the photo acceptor unit 101b can be achieved during the encapsulating process.

Here, the elastic modulus of frame member 402 means an elastic modulus of the product in the status of completely cured by a light and a heat. The frame member 402 is composed of the first resin. The first resin is a cured product of a resin material that is curable by a light and a heat cure. The resin materials that are curable by a light and a heat include photo-reactive resins such as acrylic resins and heat-reactive resins such as epoxy resins.

The elastic modulus of the resin film 412 is 3 GPa. Therefore, the resin film 412 is elastically deformed to function as a cushioning material when the upper surface of the frame member 402 is pressed to the encapsulating metal mold 111a, so that the photo acceptor units 101 are protected. Light receiving element 101 can be protected.

While the exemplary implementation having the resin film 412 disposed between the upper surface of the frame member 402 and the molding surface of the encapsulating metal mold 111a is illustrated in the present embodiment, a similar resin film may alternatively be disposed between the lower surface of the lead frame 104 and the molding surface of the encapsulating metal mold 111b and may be pressed against thereof. Such alternative configuration prevents the melted encapsulating resin from entering into a gap between the lower surface of the lead frame 104 and the molding surface of the encapsulating metal mold 111b.

Fifth Embodiment

Figure 10A:
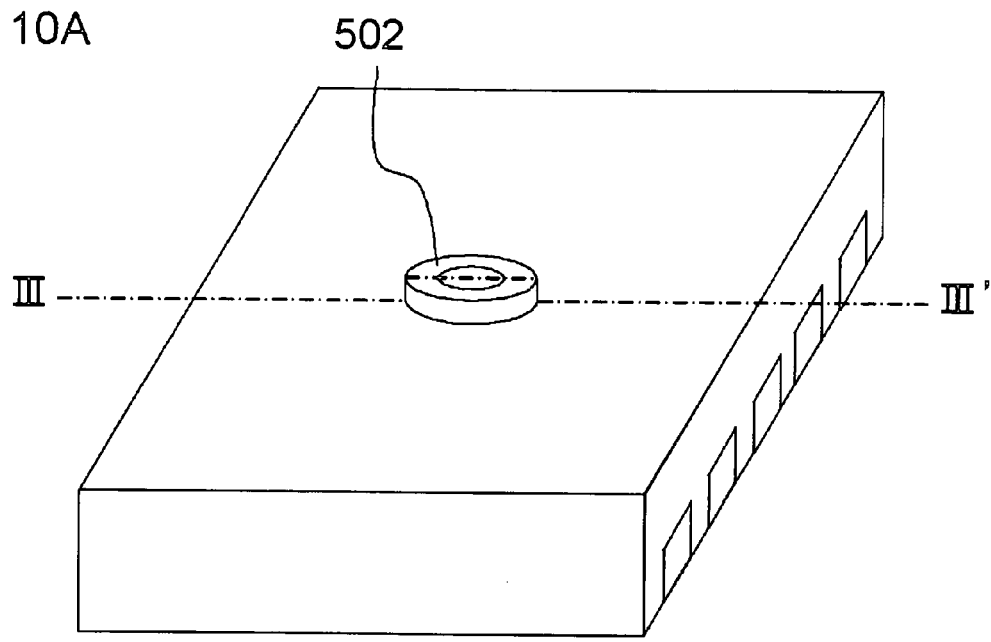
FIG. 10A is a perspective view, illustrating an electronic device in fifth embodiment.
Figure 10B:
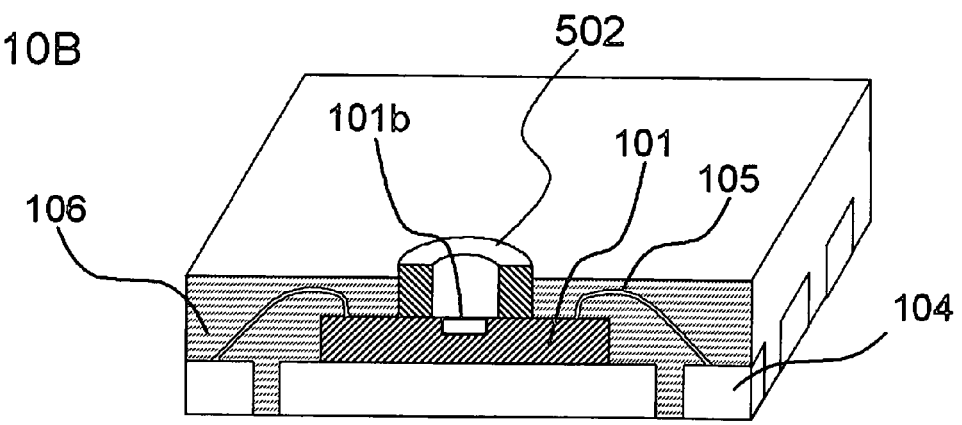
FIG. 10B is a cross-sectional view of the electronic device shown in FIG. 10A along line III-III'.

FIG. 10A is a perspective view, illustrating an electronic device in fifth embodiment, and FIG. 10B is a cross-sectional view along line III-III' in FIG. 10A. While the first embodiment is configured that the upper surface of the frame member and the upper surface of the encapsulating resin layer form a common plane, the present embodiment is configured that the upper surface of the frame member is higher than the upper surface of the encapsulating resin layer and protrudes toward the upper side. A process for manufacturing the electronic device in fifth embodiment is similar to the process for manufacturing the electronic device in first embodiment as shown in FIG. 2A to FIG. 5C.

A variation of a height of a frame member 502 in the process for manufacturing an electronic device in experimental manufactures was about 10 micrometer by standard deviation. Here, the variation of the height of the frame member 502 is a difference in the height of the frame member 502, which is possibly caused due to changes in light intensity in an exposure process or changes in type of developing solution or in processing time in an developing process during the operation of forming the frame member 502 in the process for forming the film composed of the first resin and having a uniform thickness by a photolithographic process. Taking such variation of height in the manufacturing process into account, if the minimum height of the frame member 502 is designed to be not higher than the encapsulating resin layer 106, the second resin (encapsulating resin) may possibly be entered in the interior of the frame member 502, destroying the hollow portion.

On the contrary, in the electronic device of the present embodiment, the upper surface of the frame member 502 is higher than the upper surface of the encapsulating resin layer 106 by 10 micrometers to 60 micrometers, as shown in FIG. 10A. The height of the frame member 502 that satisfies the above-described criterion may be obtained by designing the frame member 502 to be higher than the upper surface of the encapsulating resin layer 106 by about 30 micrometers, which is threefold of the standard deviation of the variation in the height of the frame member 502. Such design of the height of the frame member 502 may also be suitably achieved by suitably adjusting a pressure for pressing against the frame member 502 in the encapsulating operation or the like.

Advantageous effects obtained in the electronic device of fifth embodiment are similar to that obtained in first embodiment. In addition, even if the upper surface of frame member 502 is higher than the upper surface of the encapsulating resin layer 106 by threefold of the standard deviation of the variation in the height of the frame member 502, unwanted permeation of the encapsulating resin into the hollow portion of the frame member 502 can be inhibited, and therefore the configuration of the present embodiment can provide the electronic device that exhibits an improved reliability. Consequently, even if a variation in the height of the frame member 502 of about 10 micrometers by standard deviation is caused in the process for manufacturing the electronic device, an unwanted permeation of the encapsulating resin in the interior of the frame member 502, which leads to a breakdown of the hollow portion and a contamination of the photo acceptor unit 101b, can be inhibited.

Further, as shown in FIG. 10B, the configuration of the upper surface of the frame member 502, which is higher than the upper surface of the encapsulating resin layer 106 can provide a larger pressure applied to the frame member 502 when the frame member is pressed against the molding surfaces of the encapsulating metal molds 111a and 111b (see FIG. 4A). Therefore, a further strengthened protection for a permeation of the encapsulating resin into the hollow portion in the frame member 502 can be achieved, providing a further improved protection for the photo acceptor unit 101b.

Sixth Embodiment

FIGS. 11A to 11G are cross-sectional views, illustrating a manufacturing process of an electronic device in sixth embodiment.

While the frame member in first embodiment is formed of a single layer of the first resin, an electronic device in sixth embodiment is configured that a frame member is formed of laminated two plies of films composed of first resin and thus is configured of double layers having larger height. Other configurations of the present embodiment are similar to first embodiment. A frame member 602 of the electronic device in sixth embodiment is formed by the manufacturing process that is illustrated in FIGS. 11A to 11G. Other manufacturing process operations are similar to the operations in first embodiment, and thus the detailed description thereof is not repeated.

Figure 11A:
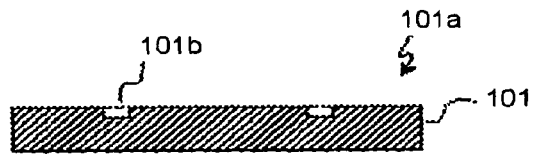
FIGS. 11A to 11G are cross-sectional views, illustrating a process for manufacturing the electronic device in sixth embodiment.

First of all, as shown in FIG. 11A, a wafer 101a is prepared.

The wafer 101a is provided with a plurality of light receiving elements 101 formed therein, and photo acceptor units 101b are exposed in the surfaces of respective light receiving elements 101. Here, among a plurality of light receiving elements 101 arranged in the wafer 101a, only two light receiving elements 101 are illustrated in FIG. 11A, and two photo acceptor units 101b are exposed.

Figure 11B:
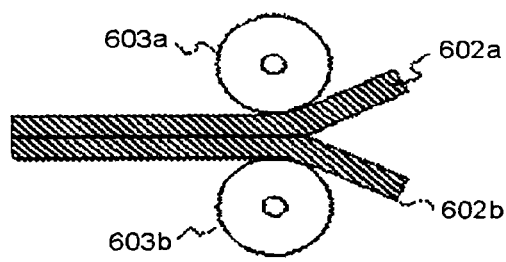
Figure 11C:
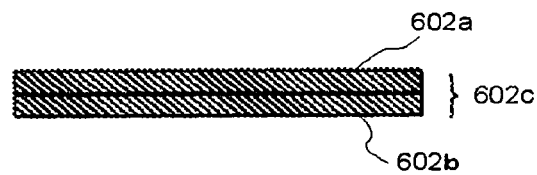

Next, as shown in FIG. 11B, resin films 602a and 602b formed to have a film-form having a thickness of 0.06 mm and composed of a resin material that is curable by a light and a heat are prepared. The resin film 602a and the resin film 602b are passed through a roll 603a and a roll 603b of a roller while a pressure is exerted thereon by a roll laminator process to obtain a laminated member so that a resin film 602c having substantially no "distortion" or "wrinkle" is obtained. Since a film having uniform thickness is employed for each of the resin films 602a and 602b, the resin film 602c composed of the laminated member of the resin film 602a and the resin film 602b is also a film having a uniform thickness (FIG. 11C).

Figure 11D:
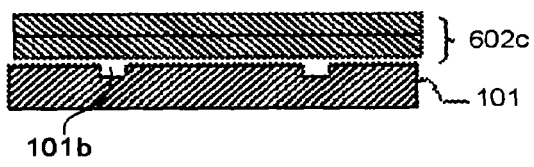

Next, as shown in FIG. 11D, the resin film 602c is installed on the light receiving element 101 (wafer 101a) by a vacuum laminator process so that substantially no bubble or the like is generated in the contact surface between the resin film 602c and the wafer 101a, thereby covering the entire wafer 101a with the resin film 602c. The thickness of the resin film 602c is 0.12 mm.

Figure 11E:
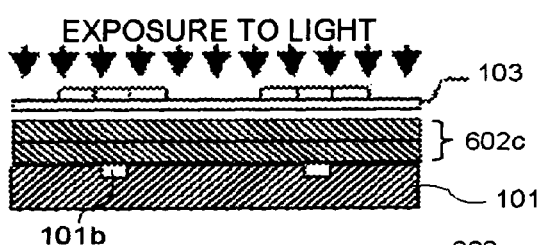

Then, as shown in FIG. 11E, an exposure process is performed by employing an exposure mask 103 to pattern the resin film 602c, thereby forming the frame member 602.

Figure 11F:
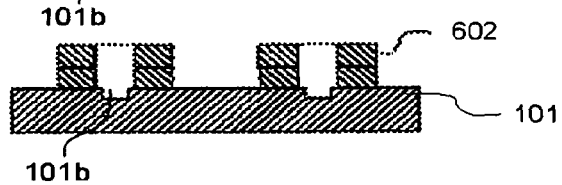

Further, as shown in FIG. 11F, a developing process is performed to partially remove the resin film 602c except the corresponding portions of the frame members 602, so that the frame members 602 provided to surround the associated photo acceptor units 101b are formed. An experimental manufacture shows that the frame member 602 of the resin film 602c, which is composed a laminated member of the resin film 602a and the resin film 602b, can be formed by employing a photolithographic process.

Advantageous effects obtained in the electronic device of sixth embodiment are similar to that obtained in first embodiment. In the present embodiment, the resin film 603c is composed of dual-layered film-form resins of the first resin. This allows ensuring the sufficient thickness of resin film 603c to be equal to or larger than 0.08 mm. Solvent employed in handling the first resin is necessary to be removed for providing a form of a film. In consideration of the removal of the solvent, a use of a thicker resin film 603c having a thickness of larger than 0.08 mm causes a difficulty in removing the solvent therefrom. More specifically, it is difficult to eliminate a solvent from a product such as a film. Consequently, the use of the laminated member of the two films having a thickness of equal to or less than 0.08 mm, which allows easier removal of the solvent and easier processing, or in other words, the use of the laminated member of the film-formed first resins, provides an increased film thickness of the resin film 603c.

In addition, the lamination process of the resin films 602a and 602b is completed in advance before forming the laminated resin film 602c on the wafer 101a, so that a creation of a "distortion" or a "wrinkle" in the resin films 602a and 602b (resin film 602c) due to an adhesiveness or a stickiness between the resin films 602a and 602b can be reduced. More specifically, in the case of forming the resin films 602a and 602b in sequence on the wafer 101a, when the first ply of resin film, namely the resin film 602a for example, is formed and then the second ply of resin film, namely the resin film 602b for example, is formed, a creation of a "distortion" or a "wrinkle" in the resin films 602a and 602b (resin film 602c) due to the stickiness of the resin films 602a and 602b can be reduced.

In addition, the above-mentioned roll laminator process may be employed for forming the laminated member of the resin films 602a and 602b. The roll laminator process provides limited locations of the pressed sites in the resin films 602a and 602b, and thus, even if the stickiness of the resin films causes a "distortion" or a "wrinkle", such smaller "distortion" or "wrinkle" may be compensated to larger non-pressed sites in the resin films 602a and 602b, resulting in forming the laminated member of the resin films with substantially no "distortion" or "wrinkle".

Alternatively, a vacuum laminator process may also be employed in the process for forming the laminated member of the resin film 602c on the wafer 101a. More specifically, a use of the vacuum laminator process allows an easier defoaming from the interface between the wafer 101a and the resin film 602c, and also allows uniformly pressurizing over the entire wafer 101 even if a thinner wafer 101a is employed, thereby avoiding a crack created in the wafer 101a.

Figure 11G:
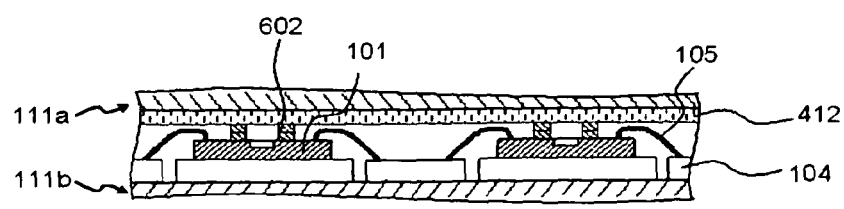
Figure 12:
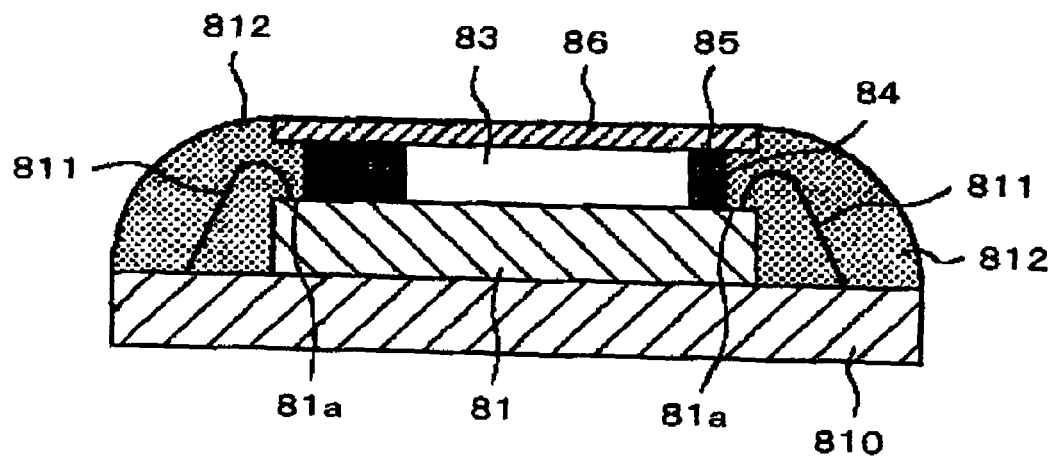
FIG. 12 is a cross-sectional view, illustrating a conventional electronic device.
Figure 13:
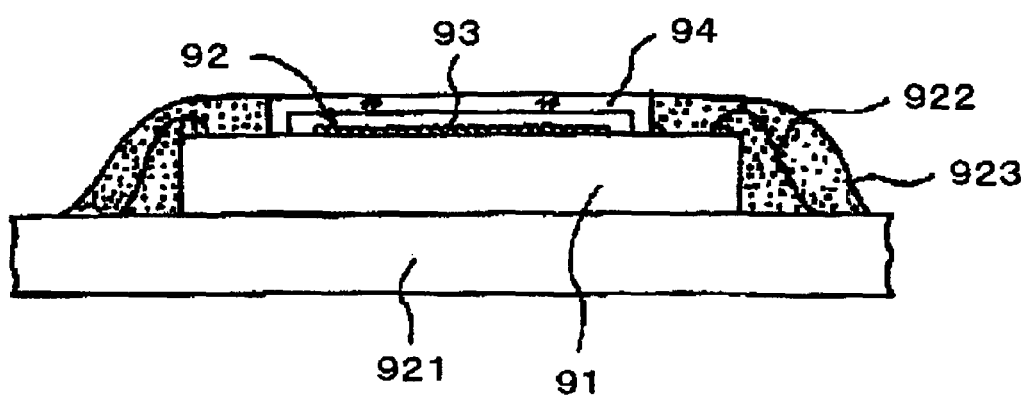
FIG. 13 is a cross-sectional view, illustrating a conventional electronic device.
Figure 14:
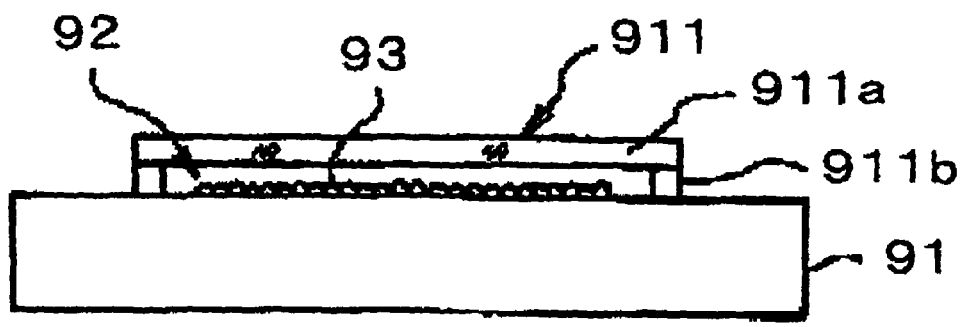
FIG. 14 is a cross-sectional view, illustrating a conventional electronic device.

The use of the laminated member of the resin films for forming the frame member 602 allows providing an increased height of the frame member 602, which leads to an increased distance between an apex of the metal filament 105 and the encapsulating metal molds 111a and 111b, so that an unwanted contact with the metal filament 105 can be prevented with an increased distance (see FIG. 11G). Further, an increased height of the frame member 602 allows providing an increased flexibility in the design for the heights of the encapsulating resin layer 106 and the frame member 602. As described in first embodiment, the permitted difference between the vertical dimension (height) of the frame member 602 and the vertical dimension (thickness) of the encapsulating resin layer 106 is equal to or smaller than 0.05 mm. While maintaining such range of the permitted difference in the vertical dimension, the vertical dimension or the height of the frame member 602 itself may be further increased by increasing the vertical dimension or the thickness of the encapsulating resin layer 106. Such increased height of the frame member 602 provides larger elastic deformation of the frame member 602, leading to a creation of larger reactive force, which, in turn, creates a stronger contact between the frame member 602 and the encapsulating metal mold 111a, thereby preventing the encapsulating resin layer 106 from entering in the interior of the frame member 602. Conversely, such increase in the height of the frame member 602 ensures sufficient thickness of the encapsulating resin layer 106, leading to providing sufficient protection with the encapsulating resin without exposing the light receiving element 101 and the metal filament 105, while ensuring the height of the frame member 602 from the encapsulating resin layer 106 to be up to 0.05 mm.

The electronic device and the process for manufacturing thereof according to the present invention are not limited to the above-described embodiments, and various modifications may be available.

While the exemplary implementations for employing the light receiving elements 101, which are the elements available in digital video disc (DVD) systems, are, for example, illustrated in the above-described embodiments, imaging devices employed for digital video cameras or digital still cameras, various types of micro-electro mechanical systems (MEMS) and electro-acoustic filters utilizing an electric oscillation may also be employed. Further, the configurations of the present invention may also be employed for semiconductor devices that requires an air space around the elements, which is requires due to a requirement for a lower dielectric constant. In addition, while the base member is described by illustrating a lead frame, the base member is not limited to lead frames, and a resin substrate or a film-form substrate, for example, may alternatively be adopted.

It is apparent that the present invention is not limited to the above embodiment, and may be modified and changed without departing from the scope and spirit of the invention.

What is claimed is:

1. An electronic device, comprising:
an element;
a lead frame including a surface contacting said element and an other surface being exposed;
a frame member including a first resin provided on the element to surround a functional unit of said element; and
a resin layer including a second resin and filling a periphery of said frame member,
wherein said frame member is constituted of a single piece,
wherein said functional unit of said element is exposed in an empty space surrounded by said frame member, said empty space extending from said element to at least an upper surface of said frame member, and
wherein the upper surface of said frame member is located higher than an upper surface of said resin layer.

2. The electronic device as set forth in claim 1, wherein said first resin comprises a cured product of a resin that is curable by a light and a heat.

3. The electronic device as set forth in claim 1, wherein an elastic modulus of a cured product of said first resin is within a range of from 1 GPa to 6 GPa at 20 degree C., and is within a range of from 10 MPa to 3 GPa at 200 degree C.

4. The electronic device as set forth in claim 1, wherein said first resin comprises a film-form resin.

5. The electronic device as set forth in claim 1, wherein the upper surface of said frame member is located to be higher than the upper surface of said resin layer by a length within a range of from 0 mm to 0.05 mm.

6. The electronic device as set forth in claim 1, wherein a height of said frame member is equal to or larger than 0.05 mm.

7. The electronic device as set forth in claim 1, wherein the upper surface of said frame member and the upper surface of said resin layer are covered with a protective film.

8. The electronic device as not forth in claim 7, wherein said protective film comprises a strippable resin.

9. The electronic device as set forth in claim 7, wherein said protective film comprises an optically transparent material.

10. The electronic device as set forth in claim 1, wherein said frame member does not overlap with the resin layer when viewed from a direction normal to a topmost surface of said element.

11. The electronic device as set forth in claim 1, wherein said empty space includes an opening formed between an upper surface of said element and the upper surface of said frame member.

12. The electronic device as set forth in claim 1, further comprising:
    a protective film that abuts the upper surface of said frame member.

13. The electronic device as set forth in claim 1, wherein an uppermost surface of the empty space is located higher than the upper surface of said resin layer.

14. The electronic device as set forth in claim 13, wherein said empty space extends from an upper surface of said functional unit to the upper surface of said frame member.

15. The electronic device as set forth in claim 1, wherein said empty space extends from an upper surface of said functional unit to the upper surface of said frame member.

16. The electronic device as set forth in claim 15, wherein said empty space extends to an internal surface of the frame member.

17. The electronic device as set forth in claim 1, wherein said empty space continuously extends from an upper surface of said functional unit to the upper surface of said frame member.

18. The electronic device as set forth in claim 1, wherein said frame member is adhered to said element.

19. The electronic device as set forth in claim 1, wherein an entirety of a space between said element and said upper surface of said frame member is devoid of any transparent member.

20. A method for manufacturing an electronic device, including:
    forming a resin film over a wafer, which has a plurality of elements formed therein;
    patterning said resin film to form a frame member, which includes a first resin and is provided to surround a functional unit of said element; and
    providing an encapsulation, comprising:
        installing said element over a base member;
        pressing molding surfaces of encapsulating metal molds against an upper surface of said frame member and a lower surface of said base member, respectively; and
        injecting a second resin into portions of spaces surrounded by the molding surface of said encapsulating metal mold except the portion surrounded by said frame member to fill a periphery of said frame member therewith.

* * * * *